(12) United States Patent
Chen et al.

(10) Patent No.: US 10,296,692 B2
(45) Date of Patent: May 21, 2019

(54) METHOD AND APPARATUS FOR DESIGN OF A METROLOGY TARGET

(71) Applicant: ASML NETHERLANDS B.V., Veldhoven (NL)

(72) Inventors: Guangqing Chen, Fremont, CA (US); Justin Ghan, Fremont, CA (US); David Harold Whysong, Dublin, CA (US)

(73) Assignee: ASML Netherlands B.V., Veldhoven (NL)

( * ) Notice: Subject to any disclaimer, the term of this patent is extended or adjusted under 35 U.S.C. 154(b) by 130 days.

(21) Appl. No.: 14/577,901

(22) Filed: Dec. 19, 2014

(65) Prior Publication Data

US 2015/0186582 A1 Jul. 2, 2015

Related U.S. Application Data

(60) Provisional application No. 61/921,907, filed on Dec. 30, 2013.

(51) Int. Cl.
*G06F 17/50* (2006.01)
*G03F 7/20* (2006.01)
*G03F 9/00* (2006.01)

(52) U.S. Cl.
CPC ...... *G06F 17/5068* (2013.01); *G03F 7/70625* (2013.01); *G03F 7/70633* (2013.01);
(Continued)

(58) Field of Classification Search
CPC .............. G06F 17/5068; G03F 9/7076; G03F 7/70633; G03F 7/70683; G03F 9/7046; G03F 7/70625; G03F 7/70641
(Continued)

(56) References Cited

U.S. PATENT DOCUMENTS 5,629,772 A * 5/1997 Ausschnitt ............. G01B 11/02
356/625
6,721,691 B2 4/2004 Bao et al.
(Continued)

FOREIGN PATENT DOCUMENTS

CN 1936710 3/2007
CN 1963679 5/2007
(Continued)

OTHER PUBLICATIONS

International Search Report and Written Opinion dated May 4, 2015 in corresponding International Patent Application No. PCT/EP2014/076543.

(Continued)

*Primary Examiner* — Jack Chiang
*Assistant Examiner* — Brandon Bowers
(74) *Attorney, Agent, or Firm* — Pillsbury Winthrop Shaw Pittman LLP

(57) ABSTRACT

A method of metrology target design is described. The method includes providing a range or a plurality of values for design parameter of a metrology target and by a processor, selecting, by solving for and/or sampling within the range or the plurality of values for the design parameters, a plurality of metrology target designs having one or more design parameters meeting a constraint for a design parameter of the metrology target.

20 Claims, 5 Drawing Sheets

(52) U.S. Cl.
CPC ...... *G03F 7/70641* (2013.01); *G03F 7/70683* (2013.01); *G03F 9/7046* (2013.01); *G03F 9/7076* (2013.01)

(58) Field of Classification Search
USPC .......................................................... 716/54
See application file for complete search history.

(56) References Cited

U.S. PATENT DOCUMENTS

| | | | |
|---|---|---|---|
| 7,020,535 B1* | 3/2006 | Bode ............... | G05B 19/41875 700/108 |
| 7,088,426 B2 | 8/2006 | Hirukawa et al. | |
| 7,200,455 B2 | 4/2007 | Schulze | |
| 7,587,704 B2 | 9/2009 | Ye et al. | |
| 7,873,504 B1 | 1/2011 | Bevis | |
| 8,056,028 B2 | 11/2011 | Cao et al. | |
| 8,180,471 B2* | 5/2012 | Good ............... | G05B 19/41875 700/108 |
| 8,612,898 B1 | 12/2013 | Siegmund | |
| 8,797,554 B2 | 8/2014 | Straaijer | |
| 8,830,472 B2 | 9/2014 | Den Boef et al. | |
| 8,918,742 B2 | 12/2014 | Feng et al. | |
| 2003/0046654 A1 | 3/2003 | Bodendorf et al. | |
| 2003/0061212 A1* | 3/2003 | Smith ................ | G06Q 10/06 |
| 2003/0223630 A1 | 12/2003 | Adel et al. | |
| 2006/0066855 A1 | 3/2006 | Boef et al. | |
| 2007/0008533 A1* | 1/2007 | Ghinovker ......... | G03F 7/70633 356/401 |
| 2007/0276634 A1* | 11/2007 | Smith ................ | G03F 1/44 703/1 |
| 2008/0094639 A1 | 4/2008 | Widmann et al. | |
| 2009/0276751 A1 | 11/2009 | Cao et al. | |
| 2010/0174033 A1 | 7/2010 | Crawford et al. | |
| 2011/0154272 A1 | 6/2011 | Hsu et al. | |
| 2012/0123748 A1 | 5/2012 | Aben et al. | |
| 2013/0014065 A1 | 1/2013 | Feng et al. | |
| 2013/0135600 A1 | 5/2013 | Middlebrooks et al. | |
| 2013/0282340 A1 | 10/2013 | Liu et al. | |
| 2013/0304408 A1 | 11/2013 | Pandev | |
| 2013/0308142 A1 | 11/2013 | Straaijer | |
| 2014/0208278 A1 | 7/2014 | Cao et al. | |
| 2014/0340682 A1* | 11/2014 | Kwak ................ | G01N 21/211 356/369 |
| 2015/0142395 A1* | 5/2015 | Cao .................... | G06F 17/5009 703/1 |

FOREIGN PATENT DOCUMENTS

| | | |
|---|---|---|
| EP | 1843210 | 10/2007 |
| JP | 2004-077550 | 3/2004 |
| JP | 2008-306030 | 12/2008 |
| JP | 2010-039382 | 2/2010 |
| JP | 2012-514871 | 6/2012 |
| JP | 2013-500586 | 1/2013 |
| JP | 2013-153167 | 8/2013 |
| JP | 2013-534044 | 8/2013 |
| KR | 10-2010-0131519 | 12/2010 |
| KR | 1020140104465 | 8/2014 |
| WO | 2010/054350 | 5/2010 |
| WO | 2014/138057 | 9/2014 |

OTHER PUBLICATIONS

Korean Office Action dated Oct. 16, 2017 in corresponding Korean Patent Application No. 10-2016-7021018.
Chinese Office Action dated Oct. 11, 2017 in corresponding Chinese Patent Application No. 201480071612.8.
Korean Notice of Allowance dated Apr. 24, 2018 in corresponding Korean Patent Application No. 10-2016-7021018.
Chinese Office Action dated Mar. 13, 2017 in corresponding Chinese Patent Application No. 201480071612.8.
Japanese Office Action dated May 29, 2017 in corresponding Japanese Patent Application No. 2016-539330 (8 pages).

* cited by examiner

METHOD AND APPARATUS FOR DESIGN OF A METROLOGY TARGET

CROSS-REFERENCE TO RELATED APPLICATIONS

This application claims the benefit under 35 USC 119(e) of prior U.S. Provisional Patent Application No. 61/921,907, filed Dec. 30, 2013, the disclosure of which is hereby incorporated by reference in its entirety.

FIELD

The present description relates to methods and apparatus to determine one or more structural parameters of a metrology target usable, for example, in the manufacture of devices by a lithographic technique and to methods of manufacturing using a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable to frequently make measurements of the structures created, e.g., for process control and verification. One or more parameters of the structures are typically measured or determined, for example the overlay error between successive layers formed in or on the substrate. There are various techniques for making measurements of the microscopic structures formed in a lithographic process. Various tools for making such measurements are known, including scanning electron microscopes, which are often used to measure critical dimension (CD), and specialized tools to measure overlay, the accuracy of alignment of two layers in a device. An example of such a tool is a scatterometer developed for use in the lithographic field. This device directs a beam of radiation onto a target on the surface of the substrate and measures one or more properties of the redirected radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods, library searches, and principal component analysis.

SUMMARY

It is desirable, for example, to provide methods and apparatus for design of a metrology target. Furthermore, although not limited to this, it would be of advantage if the methods and apparatus could be applied to minimizing overlay error in lithographic process.

In an aspect, there is provided a method of metrology target design. The method includes providing a range or a plurality of values for each of a plurality of geometric dimensions of a metrology target, providing a constraint for each of a plurality of the geometric dimensions of the metrology target, and selecting, by a processor sampling within the range or the plurality of values for the dimensions, a plurality of metrology target designs having dimensions meeting the constraints.

BRIEF DESCRIPTION OF THE DRAWINGS

Embodiments will now be described, by way of example only, with reference to the accompanying drawings in which.

DETAILED DESCRIPTION

Before describing embodiments in detail, it is instructive to present an example environment in which embodiments may be implemented.

Figure 1:
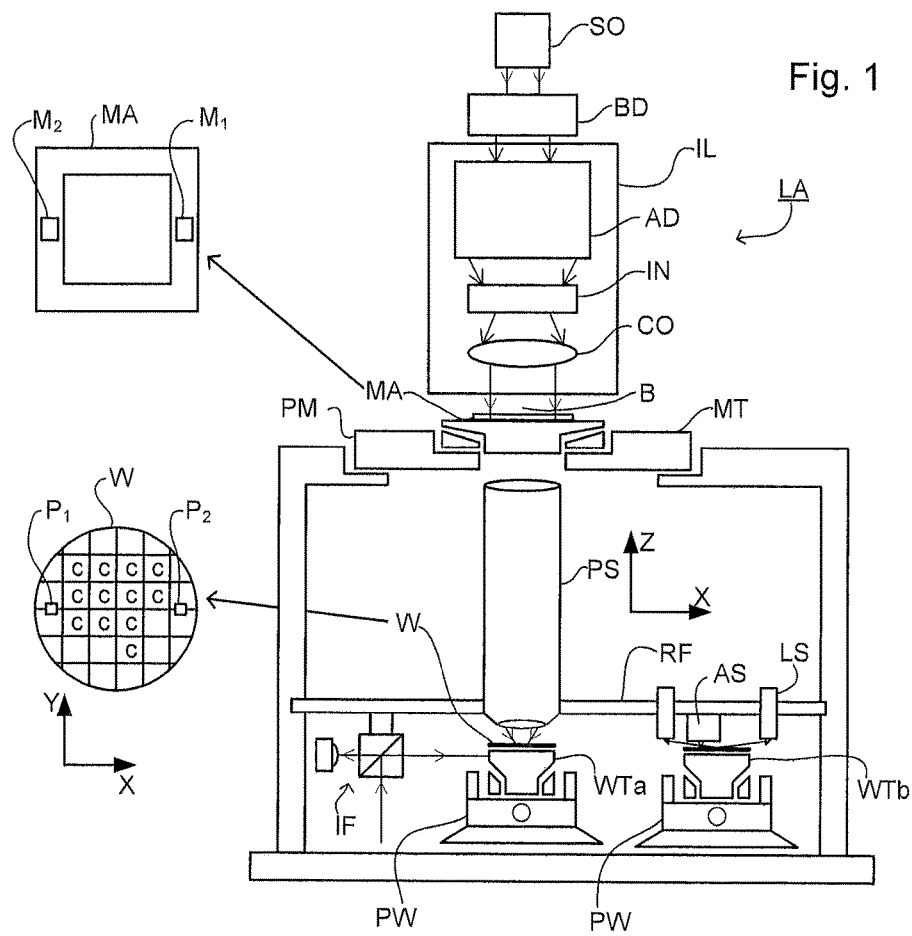
FIG. 1 schematically depicts an embodiment of a lithographic apparatus.

FIG. 1 schematically depicts a lithographic apparatus LA. The apparatus comprises:

an illumination system (illuminator) IL configured to condition a radiation beam B (e.g. DUV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support structure holds the patterning device in a manner that depends on the orientation of the patterning device, the design of the lithographic apparatus, and other conditions, such as for example whether or not the patterning device is held in a vacuum environment. The patterning device support structure can use mechanical, vacuum, electrostatic or other clamping techniques to hold the patterning device. The patterning device support structure may be a frame or a table, for example, which may be fixed or movable as required. The patterning device support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more tables (e.g., two or more substrate table, two or more patterning device support structures, or a substrate table and metrology table). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WTa can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan. In general, movement of the patterning device support (e.g., mask table) MT may be realized with the aid of a long-stroke module (coarse positioning) and a short-stroke module (fine positioning), which form part of the first positioner PM. Similarly, movement of the substrate table WTa may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
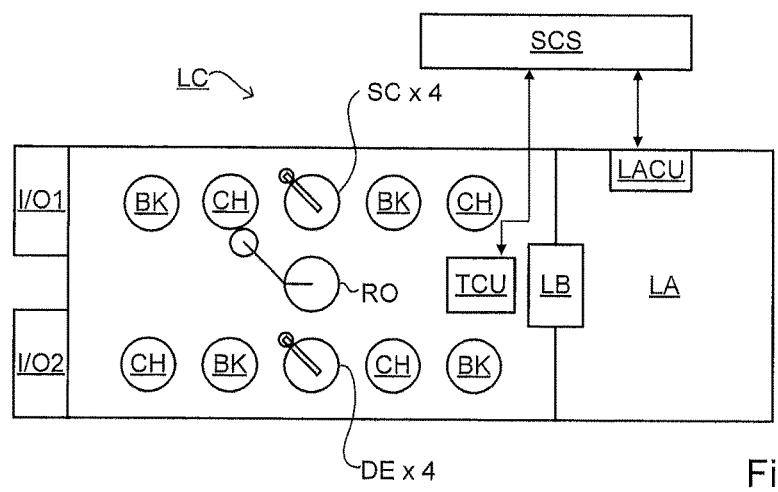
FIG. 2 schematically depicts an embodiment of a lithographic cell or cluster.

As shown in FIG. 2, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

Figure 3:
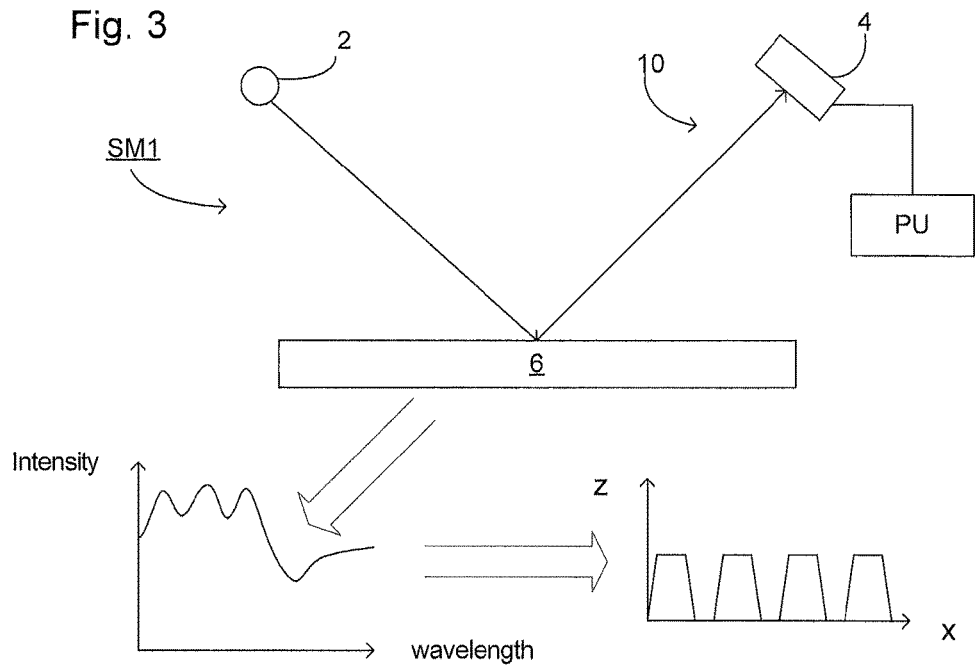
FIG. 3 schematically depicts an embodiment of a scatterometer.

FIG. 3 depicts an embodiment of a scatterometer SM1. It comprises a broadband (white light) radiation projector 2 which projects radiation onto a substrate 6. The reflected radiation is passed to a spectrometer detector 4, which measures a spectrum 10 (i.e. a measurement of intensity as a function of wavelength) of the specular reflected radiation. From this data, the structure or profile giving rise to the detected spectrum may be reconstructed by processing unit PU, e.g. by Rigorous Coupled Wave Analysis and non-linear regression or by comparison with a library of simulated spectra as shown at the bottom of FIG. 3. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 4:
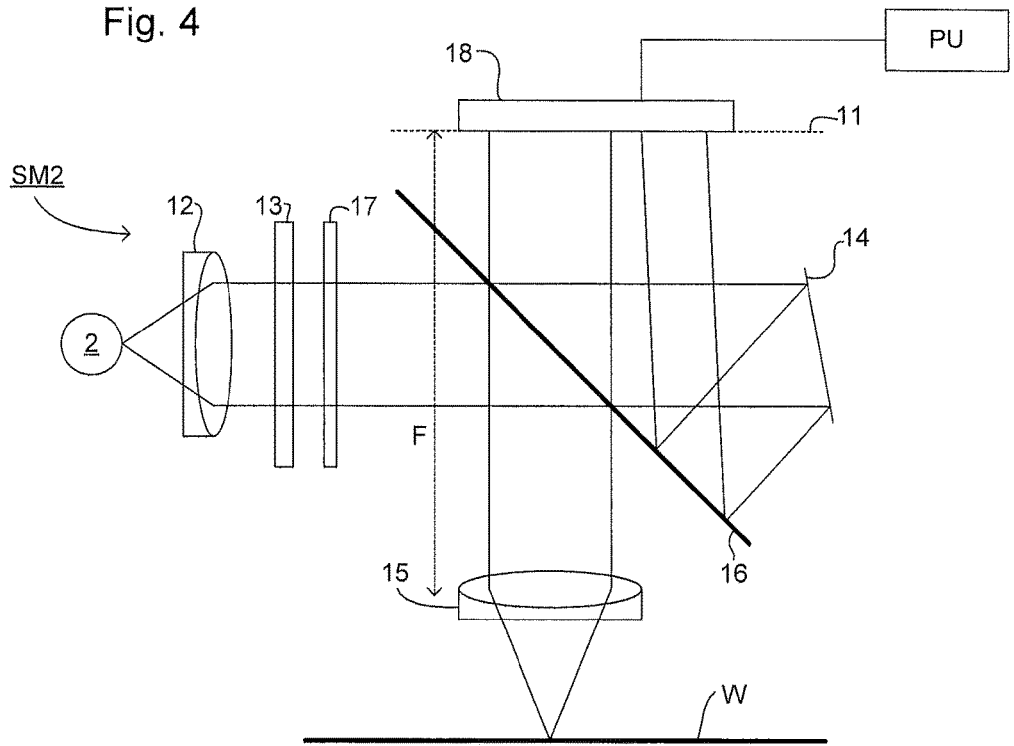
FIG. 4 schematically depicts a further embodiment of a scatterometer.

Another embodiment of a scatterometer SM2 is shown in FIG. 4. In this device, the radiation emitted by radiation source 2 is focused using lens system 12 through interference filter 13 and polarizer 17, reflected by partially reflective surface 16 and is focused onto substrate W via a microscope objective lens 15, which has a high numerical aperture (NA), desirably at least 0.9 or at least 0.95. An immersion scatterometer may even have a lens with a numerical aperture over 1. The reflected radiation then transmits through partially reflective surface 16 into a detector 18 in order to have the scatter spectrum detected. The detector may be located in the back-projected pupil plane 11, which is at the focal length of the lens 15, however the pupil plane may instead be re-imaged with auxiliary optics (not shown) onto the detector 18. The pupil plane is the plane in which the radial position of radiation defines the angle of incidence and the angular position defines the azimuth angle of the radiation. The detector is desirably a two-dimensional detector so that a two-dimensional angular scatter spectrum (i.e. a measurement of intensity as a function of angle of scatter) of the substrate target can be measured. The detector 18 may be, for example, an array of CCD or CMOS sensors, and may have an integration time of, for example, 40 milliseconds per frame.

A reference beam is often used, for example, to measure the intensity of the incident radiation. To do this, when the radiation beam is incident on the partially reflective surface 16 part of it is transmitted through the surface as a reference beam towards a reference mirror 14. The reference beam is then projected onto a different part of the same detector 18.

One or more interference filters 13 are available to select a wavelength of interest in the range of, say, 405-790 nm or even lower, such as 200-300 nm. The interference filter(s) may be tunable rather than comprising a set of different filters. A grating could be used instead of or in addition to one or more interference filters.

The detector 18 may measure the intensity of scattered radiation at a single wavelength (or narrow wavelength range), the intensity separately at multiple wavelengths or the intensity integrated over a wavelength range. Further, the detector may separately measure the intensity of transverse magnetic—(TM) and transverse electric—(TE) polarized radiation and/or the phase difference between the transverse magnetic- and transverse electric-polarized radiation.

Using a broadband radiation source 2 (i.e. one with a wide range of radiation frequencies or wavelengths—and therefore of colors) is possible, which gives a large etendue, allowing the mixing of multiple wavelengths. The plurality of wavelengths in the broadband desirably each has a bandwidth of $\delta\lambda$ and a spacing of at least $2\delta\lambda$ (i.e. twice the wavelength bandwidth). Several "sources" of radiation may be different portions of an extended radiation source which have been split using, e.g., fiber bundles. In this way, angle resolved scatter spectra may be measured at multiple wavelengths in parallel. A 3-D spectrum (wavelength and two different angles) may be measured, which contains more information than a 2-D spectrum. This allows more information to be measured which increases metrology process robustness. This is described in more detail in U.S. patent application publication no. US 2006-0066855, which document is hereby incorporated in its entirety by reference.

By comparing one or more properties of the beam before and after it has been redirected by the target, one or more properties of the substrate may be determined. This may be done, for example, by comparing the redirected beam with theoretical redirected beams calculated using a model of the substrate and searching for the model that gives the best fit between measured and calculated redirected beams. Typically a parameterized generic model is used and the parameters of the model, for example width, height and sidewall angle of the pattern, are varied until the best match is obtained.

Two main types of scatterometer are used. A spectroscopic scatterometer directs a broadband radiation beam onto the substrate and measures the spectrum (intensity as a function of wavelength) of the radiation scattered into a particular narrow angular range. An angularly resolved scatterometer uses a monochromatic radiation beam and measures the intensity (or intensity ratio and phase difference in case of an ellipsometric configuration) of the scattered radiation as a function of angle. Alternatively, measurement signals of different wavelengths may be measured separately and combined at an analysis stage. Polarized radiation may be used to generate more than one spectrum from the same substrate.

In order to determine one or more parameters of the substrate, a best match is typically found between the theoretical spectrum produced from a model of the substrate and the measured spectrum produced by the redirected beam as a function of either wavelength (spectroscopic scatterometer) or angle (angularly resolved scatterometer). To find the best match there are various methods, which may be combined. For example, a first method is an iterative search method, where a first set of model parameters is used to calculate a first spectrum, a comparison being made with the measured spectrum. Then a second set of model parameters is selected, a second spectrum is calculated and a comparison of the second spectrum is made with the measured spectrum. These steps are repeated with the goal of finding the set of parameters that gives the best matching spectrum. Typically, the information from the comparison is used to steer the selection of the subsequent set of parameters. This process is known as an iterative search technique. The model with the set of parameters that gives the best match is considered to be the best description of the measured substrate.

A second method is to make a library of spectra, each spectrum corresponding to a specific set of model parameters. Typically the sets of model parameters are chosen to cover all or almost all possible variations of substrate properties. The measured spectrum is compared to the spectra in the library. Similarly to the iterative search method, the model with the set of parameters corresponding to the spectrum that gives the best match is considered to be the best description of the measured substrate. Interpolation techniques may be used to determine more accurately the best set of parameters in this library search technique.

In any method, sufficient data points (wavelengths and/or angles) in the calculated spectrum should be used in order to enable an accurate match, typically between 80 up to 800 data points or more for each spectrum. Using an iterative method, each iteration for each parameter value would involve calculation at 80 or more data points. This is multiplied by the number of iterations needed to obtain the correct profile parameters. Thus many calculations may be required. In practice this leads to a compromise between accuracy and speed of processing. In the library approach, there is a similar compromise between accuracy and the time required to set up the library.

In any of the scatterometers described above, the target on substrate W may be a grating which is printed such that after development, the bars are formed of solid resist lines. The bars may alternatively be etched into the substrate. The target pattern is chosen to be sensitive to a parameter of interest, such as focus, dose, overlay, chromatic aberration in the lithographic projection apparatus, etc., such that variation in the relevant parameter will manifest as variation in the printed target. For example, the target pattern may be sensitive to chromatic aberration in the lithographic projection apparatus, particularly the projection system PL, and illumination symmetry and the presence of such aberration will manifest itself in a variation in the printed target pattern. Accordingly, the scatterometry data of the printed target pattern is used to reconstruct the target pattern. The parameters of the target pattern, such as line width and shape, may be input to the reconstruction process, performed by a processing unit PU, from knowledge of the printing step and/or other scatterometry processes.

While embodiments of a scatterometer have been described herein, other types of metrology apparatus may be used in an embodiment. For example, a dark field metrology apparatus such as described in U.S. Patent Application Publication No. 2013-0308142, which is incorporated herein in its entirety by reference, may be used. Further, those other types of metrology apparatus may use a completely different technique than scatterometry.

Figure 5:
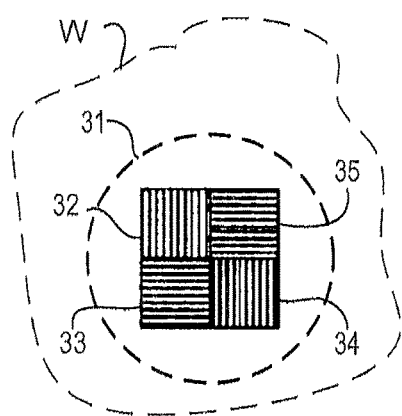
FIG. 5 schematically depicts a form of multiple grating target and an outline of a measurement spot on a substrate.

FIG. 5 depicts an example composite metrology target formed on a substrate according to known practice. The composite target comprises four gratings 32, 33, 34, 35 positioned closely together so that they will all be within a measurement spot 31 formed by the illumination beam of the metrology apparatus. The four targets thus are all simultaneously illuminated and simultaneously imaged on sensor 4, 18. In an example dedicated to overlay measurement, gratings 32, 33, 34, 35 are themselves composite gratings formed by overlying gratings that are patterned in different layers of the semi-conductor device formed on substrate W. Gratings 32, 33, 34, 35 may have differently biased overlay offsets in order to facilitate measurement of overlay between the layers in which the different parts of the composite gratings are formed. Gratings 32, 33, 34, 35 may also differ in their orientation, as shown, so as to diffract incoming radiation in X and Y directions. In one example, gratings 32 and 34 are X-direction gratings with biases of +d, −d, respectively. This means that grating 32 has its overlying components arranged so that if they were both printed exactly at their nominal locations, one of the components would be offset relative to the other by a distance d. Grating 34 has its components arranged so that if perfectly printed there would be an offset of d, but in the opposite direction to the first grating and so on. Gratings 33 and 35 may be Y-direction gratings with offsets +d and −d respectively. While four gratings are illustrated, another embodiment may include a larger matrix to obtain desired accuracy. For example, a 3×3 array of nine composite gratings may have biases −4d, −3d, −2d, −d, 0, +d, +2d, +3d, +4d. Separate images of these gratings can be identified in the image captured by sensor 4, 18.

The metrology targets as described herein may be, for example, overlay targets designed for use with a metrology tool such as Yieldstar stand-alone or integrated metrology tool, and/or alignment targets such as those typically used with a TwinScan lithographic system, both available from ASML.

In general, metrology targets for use with such systems should be printed on the substrate with dimensions that meet the design specification for the particular microelectronic device to be imaged on that substrate. As processes continue to push against the limits of lithographic device imaging resolution in advanced process nodes, the design rule and process compatibility requirements place stress on the selection of appropriate targets. As the targets themselves become more advanced, often requiring the use of resolution enhancement technology, such as phase-shift patterning devices, and optical proximity correction, the printability of the target within the process design rules becomes less certain. As a result, proposed metrology target design may be subject to testing and/or simulation in order to confirm their suitability and/or viability, both from a printability and a detectability standpoint. In a commercial environment, good overlay mark detectability may be considered to be a combination of low total measurement uncertainty as well as a short move-acquire-move time, as slow acquisition is detrimental to total throughput for the production line. Modern micro-diffraction-based-overlay targets (μDBO) may be on the order of 10 μm on a side, which provides an inherently low detection signal compared to 40×160 μm$^2$ targets such as those used in the context of monitor substrates.

Additionally, once metrology targets that meet the above criteria have been selected, there is a possibility that detectability will change with respect to process variations, such as film thickness variation, various etch biases, and geometry asymmetries induced by the etch and/or polish processes. Therefore, it may be useful to select a target that has low detectability variation and low overlay/alignment variation against various process variations. Likewise, the fingerprint (printing characteristics, including, for example, lens aberration) of the specific machine that is to be used to produce the microelectronic device to be imaged will, in general, affect the imaging and production of the metrology targets. It may therefore be useful to ensure that the metrology targets are resistant to fingerprint effects, as some patterns will be more or less affected by a particular lithographic fingerprint.

Figure 6A:
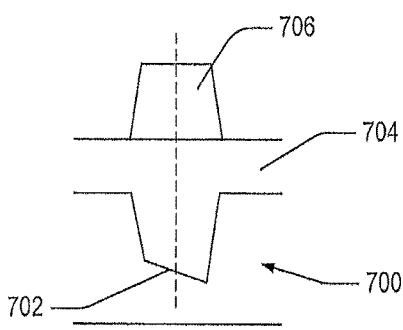
FIGS. 6A and 6B schematically depict a model structure of one period of an overlay target showing an example of variation of the target from ideal, e.g., two types of process-induced asymmetry.
Figure 6B:
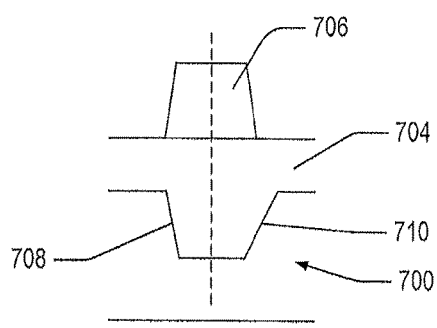

FIGS. 6A and 6B schematically show a model structure of one period of an overlay target showing an example of variation of the target from ideal, e.g., two types of process-induced asymmetry. With reference to FIG. 6A, the substrate W is patterned with a bottom grating 700, etched into a substrate layer. The etch process used for the bottom grating results in a tilt of the floor 702 of the etched trench. This floor tilt, FT, can be represented as a structural parameter, for example as a measure of the height drop across the floor 702, in nm. A BARC (bottom anti-reflective coating) layer 704 supports the patterned resist feature of the top grating 706. In this example, the alignment overlay error between the top and bottom grating is zero, as the centers of the top and bottom grating features are at the same lateral position. However, the bottom-layer process-induced asymmetry, i.e. the floor tilt, leads to an error in the measured overlay offset, in this case giving a non-zero overlay offset. FIG. 6B shows another type of bottom-layer process-induced asymmetry that can lead to an error in the measured overlay offset. This is side wall angle (SWA) unbalance, SW Aun. Features in common with those of FIG. 6A are labeled the same. Here, one side wall 708 of the bottom grating has a different slope to the other side wall 710. This unbalance can be represented as a structural parameter, for example as a ratio of the two side wall angles relative to the plane of the substrate. Both asymmetry parameters floor tilt and SWA unbalance give rise to an "apparent" overlay error between the top and bottom gratings. This apparent overlay error comes on top of the "real" overlay error to be measured between the top and bottom gratings.

Accordingly, in an embodiment, it is desirable to simulate various metrology target designs in order to confirm the suitability and/or viability of one or more of the proposed target designs.

Figure 7:
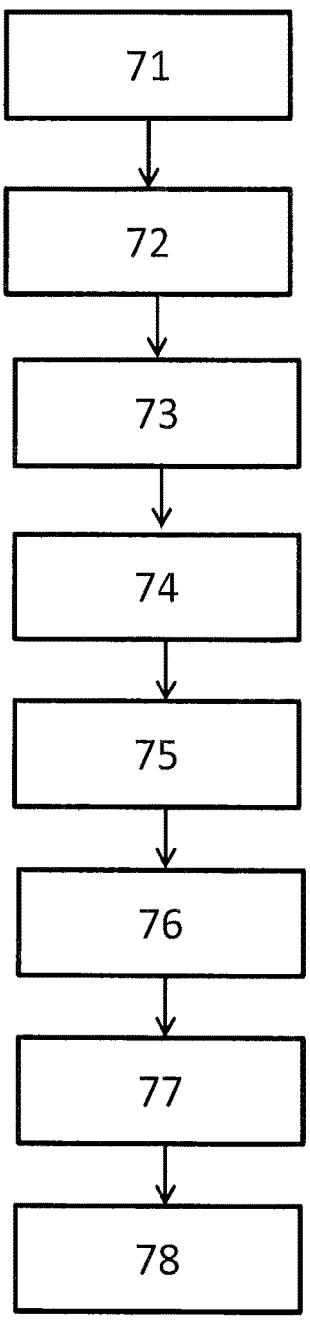
FIG. 7 is an exemplary block diagram illustrating the functional modules of a manufacturing process simulation model.

In a system for simulating a manufacturing process involving lithography and metrology targets, the major manufacturing system components and/or processes can be described by various functional modules, for example, as illustrated in FIG. 7. Referring to FIG. 7, the functional modules may include a design layout module 71, which defines a metrology target (and/or microelectronic device) design pattern; a patterning device layout module 72, which defines how the patterning device pattern is laid out in polygons based on the target design; a patterning device model module 73, which models the physical properties of the pixilated and continuous-tone patterning device to be utilized during the simulation process; an optical model module 74, which defines the performance of the optical components of the lithography system; a resist model module 75, which defines the performance of the resist being utilized in the given process; a process model module 76, which defines performance of the post-resist development processes (e.g., etch); and metrology module 77, which defines the performance of a metrology system used with the metrology target and thus the performance of the metrology target when used with the metrology system. The results of one or more of the simulation modules, for example, predicted contours and CDs, are provided in a result module 78.

The properties of the illumination and projection optics are captured in the optical model module 74 that includes, but is not limited to, NA-sigma (σ) settings as well as any particular illumination source shape, where σ (or sigma) is outer radial extent of the illuminator. The optical properties of the photo-resist layer coated on a substrate—i.e. refractive index, film thickness, propagation and polarization effects—may also be captured as part of the optical model module 74, whereas the resist model module 75 describes the effects of chemical processes which occur during resist exposure, post exposure bake (PEB) and development, in order to predict, for example, contours of resist features formed on the substrate. The patterning device model module 73 captures how the target design features are laid out in the pattern of the patterning device and may include a representation of detailed physical properties of the patterning device, as described, for example, in U.S. Pat. No. 7,587,704. The objective of the simulation is to accurately predict, for example, edge placements and critical dimensions (CDs), which can then be compared against the target design. The target design is generally defined as the pre-OPC patterning device layout, and will be provided in a standardized digital file format such as GDSII or OASIS.

In general, the connection between the optical and the resist model is a simulated aerial image intensity within the resist layer, which arises from the projection of radiation onto the substrate, refraction at the resist interface and multiple reflections in the resist film stack. The radiation intensity distribution (aerial image intensity) is turned into a latent "resist image" by absorption of photons, which is further modified by diffusion processes and various loading effects. Efficient simulation methods that are fast enough for full-chip applications approximate the realistic 3-dimensional intensity distribution in the resist stack by a 2-dimensional aerial (and resist) image.

Thus, the model formulation describes most, if not all, of the known physics and chemistry of the overall process, and each of the model parameters desirably corresponds to a distinct physical or chemical effect. The model formulation thus sets an upper bound on how well the model can be used to simulate the overall manufacturing process. However, sometimes the model parameters may be inaccurate from measurement and reading errors, and there may be other imperfections in the system. With precise calibration of the model parameters, extremely accurate simulations can be done.

In a manufacturing process, variations in various process parameters have significant impact on the design of a suitable target that can faithfully reflect a device design. Such process parameters include, but are not limited to, side-wall angle (determined by the etching or development process), refractive index (of a device layer or a resist layer), thickness (of a device layer or a resist layer), frequency of incident radiation, etch depth, floor tilt, extinction coefficient for the radiation source, coating asymmetry (for a resist layer or a device layer), variation in erosion during a chemical-mechanical polishing process, and the like.

A metrology target design can be characterized by various parameters such as, for example, target coefficient (TC), stack sensitivity (SS), overlay impact (OV), or the like. Stack sensitivity can be understood as a measurement of how much the intensity of the signal changes as overlay changes because of diffraction between target (e.g., grating) layers. Target coefficient can be understood as a measurement of signal-to-noise ratio for a particular measurement time as a result of variations in photon collection by the measurement system. In an embodiment, the target coefficient can also be thought of as the ratio of stack sensitivity to photon noise; that is, the signal (i.e., the stack sensitivity) may be divided by a measurement of the photon noise to determine the target coefficient. Overlay impact measures the change in overlay error as a function of target design.

Described herein is a computer-implemented method of defining a metrology target design for use in, e.g., a metrology system simulation or in a target manufacturing process simulation (e.g., including exposing the metrology target using a lithographic process, developing the metrology target, etching the target, etc.). In an embodiment, one or more design parameters (e.g., geometric dimensions) for the target can be specified and further discrete values or a range of values can be specified for the one or more design parameters. Further, a user and/or the system may impose one or more constraints on one or more design parameters (e.g., a relationship between pitch and trench width, a limit on pitch or trench width, a relationship between CD and pitch (e.g., CD is less than pitch), etc.) either in the same layer or between layers, based on, e.g., the lithographic process for which the target is desired. In an embodiment, the one or more constraints may be on the one or more design parameters for which discrete values or a range has been specified, or on one or more other design parameters.

The computer-implemented method effectively uses the one or more constraints to define a convex polytope out of a design hypercube defined by the various design parameters (and their associated ranges or sets of discrete values) used to define the target design. The method may then determine one or more potential metrology target designs for simulation or other processing.

In an embodiment, the volume of the convex polytope may be sampled according to one or more rules to provide sample metrology target designs that meet all the constraints. One or more sampling rules as described herein may be applied to sample metrology target designs.

In an embodiment, one or more potential metrology targets design may be solved for. That is, one or more potential metrology designs may be derived by solving for permitted values using, e.g., one or more equality constraints to solve for specific values. For example, every axis need not be sampled if there are equality constraints that can be solved for values.

The potential metrology target designs may then be input to a simulation to determine, for example, the viability and/or suitability of one or more of the metrology target designs. Thus, in an embodiment, rather than performing time-consuming simulations on potentially a near infinite number of potential metrology target designs of which many may not be feasible, a method as described herein can reduce the number of potential metrology target designs to a smaller set of potentially feasible metrology target designs and appropriately solve for or sample within the smaller set to generate a set of potential metrology target designs for simulation.

In an embodiment, a user of a metrology target design system may specify one or more of the design parameters (e.g., geometric dimensions) for the metrology target. Further, in an embodiment, the user may specify (e.g., select) the discrete values or a range of values for each of one or more of the design parameters. For example, the user may select a range or a set of values for CD, pitch, and/or trench width for the metrology target. In an embodiment, where the metrology target comprises multiple gratings, or segmented gratings, the user may select or provide a range or set of values for other design parameters, e.g., shared pitch. Additionally, or optionally, the user may define one or more constraints.

In an embodiment, the design parameters may include any one or more geometric dimensions selected from: pitch of a grating of the target, grating line CD of the target, grating trench CD of the target, one or more segmentation parameters of the lines of the grating (segmentation pitch/CD/trench in X and/or Y direction depending on segmentation type). Further, the parameters may be specified for a single layer or a plurality of layers (e.g., two layers or two layers plus an intermediate shielding layer). For a plurality of layers, they may share pitch. For other metrology targets, e.g. focus or alignment targets, other parameters may be used. Other design parameters may be physical limitations such as one or more selected from: a wavelength of radiation used in the metrology system for the target, polarization of radiation used in the metrology system, numerical aperture of the metrology system, target type, and/or a process parameter. In an embodiment, non-uniform and non-symmetric patterns, for example modulated overlay targets and focus targets, may be provided. Thus, the design parameters may be varied and not necessarily uniform in a particular direction.

Depending on the particular process being used, in an embodiment, one or more constraints may be related to a constraint between a design parameter (e.g., geometric dimension) of one layer and a design parameter (e.g., geometric dimension) of another layer.

In an embodiment, a constraint may be a metrology parameter constraint. For example, in some metrology systems, the physics of the system may place a constraint. For example, a wavelength of radiation used in the system may constrain the pitch of the target design, e.g., a lower limit. In an embodiment, there is a (upper/lower) limit on pitch as function of wavelength, the type of target and/or the aperture of the metrology system. Physical limitations that can be used as constraints include one or more selected from: a wavelength of radiation used in the metrology system, polarization of radiation used in the metrology system, numerical aperture of the metrology system, and/or target type. In an embodiment, the constraint may be a process parameter constraint (e.g., a constraint dependent on etch type, development type, resist type, etc.).

A constraint may be a linear algebraic expression. In an embodiment, the constraint may be non-linear.

Some constraints may be related to other constraints. For example, CD, pitch and trench width are related such that if any two of the three are known, the third may be fully determined.

It is to be noted that there may not be any constraints imposed because of the system. It is also possible that not all dimensions have a constraint associated with them. Moreover, not every constraint is associated with a dimension. Constraints can be expressed as mathematical equations. For example, dual-constraints can be expressed as a pair of constraints having the form: "constraint-1 modulo constraint-2==0."

In mathematical form, each target design parameter can be thought of an orthogonal axis of a hypercube. Thus, if there are n design parameters to be considered, the hypercube defined by those design parameters is n-dimensional. The one or more constraints (e.g., user supplied and/or identified by the metrology target design system such a physical limitations of the metrology system and/or process) define a convex polytope within this hypercube such that each constraint provides a limit on one or more parameters, thereby defining a side of the polytope along the one or more parameter axes. As such, usable target designs can be found inside of or on this polytope. When a set of values or a range are provided for particular design parameters, a desired metrology target design can be found by, e.g., solving a constraint such as an equality constraint and/or sampling the volume of the polytope using one or more rules (e.g., to completely and uniformly sample over the set of values or a range provided by the user). A list of coordinates that satisfy all constraints and lie in or on the polytope defines all usable metrology target designs. All metrology target designs meeting the constraints within the polytope are usable.

It is to be noted, however, that not all metrology target design thus discovered are equally representative of process variations. As such, the metrology target designs discovered using a method described herein may be further simulated using a lithographic model to, for example, rank them based on a key performance index or a robustness criteria.

Figure 8:
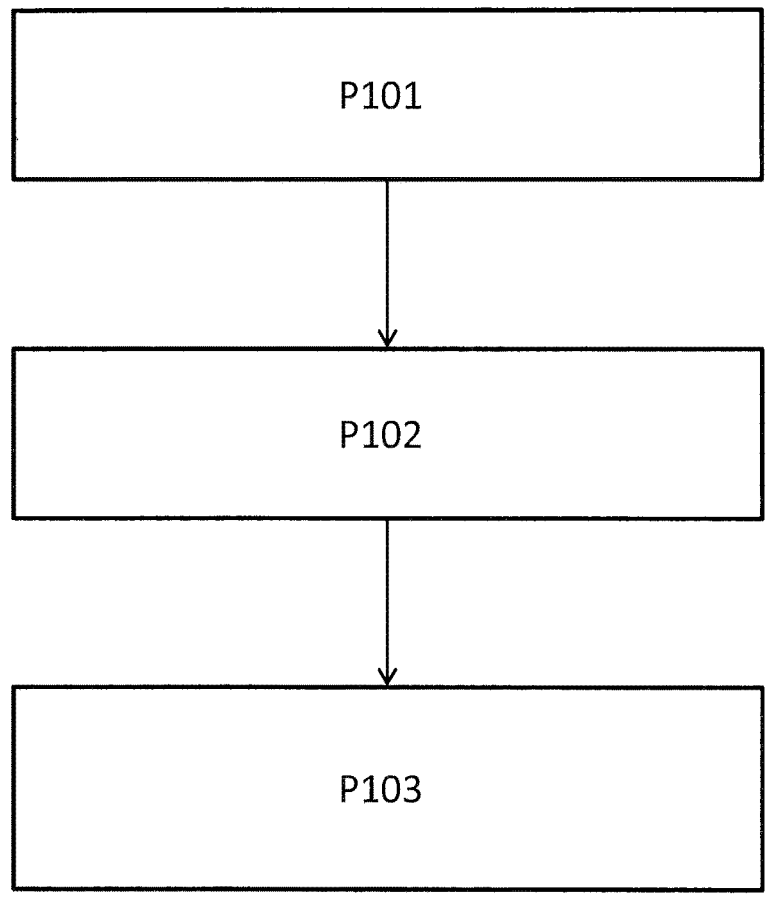
FIG. 8 schematically depicts a process for metrology target design.

FIG. 8 schematically depicts a computer-implemented method of defining a metrology target design in accordance with an embodiment. The method includes, at block P101, providing a range or a plurality of values for each of a plurality of design parameters (e.g., geometric dimensions) of a metrology target, at block P102, providing one or more constraint for one or more design parameters of the metrology target, and at block P103, by a processor, solving for and/or selecting by sampling within the range or the plurality of values for the design parameters, a plurality of metrology target designs having one or more design parameters meeting the one or more constraints. In an embodiment, each of the selected metrology target designs is further simulated using a lithographic model.

The following is a general description of an embodiment of a metrology target design definition algorithm for evaluating points from one polytope. The algorithm may repeated for a plurality of polytopes (e.g., where the design parameters and their associated values cannot define a continuous polytope and thus the algorithm may be performed for each distinct polytope).

The problem is to produce a list of coordinates (values for each variable) that solves for and/or samples the volume of the polytope both completely and uniformly, according to the dual-constraints and one or more sampling intervals.

Inputs, provided at block P101 may include:
   (i) a set of variables, each with: (a) a name and (b) a range or a plurality of discrete values;
   (ii) a set of constraints, which includes, e.g., one or more linear algebraic constraint expressions, using one or more variables and/or constants and one or more of the following operators: (a) +, −, and * and (b) >=, <=, and =(one operator per expression);
   (iii) a set of "dual constraints" as described herein;
   (iv) optionally, a sampling interval specified for one or more of the variables.

At block P102, a hypercube defined by the inputs from (i) above is constrained to define a convex polytope using the set of constraints from (ii) above. The set of dual-constraints breaks up the polytope, but it is treated as a modification of the sampling interval instead.

The constraints are simplified using algebraic substitution using the following algorithm:
1. For each constraint which is an equality, find a variable v that appears in the constraint expression that has a range with a span greater than zero (i.e. the beginning of the range does not equal the end of the range).
2. Algebraically isolate v, i.e., move it to one side of the equation, and divide the equation by its coefficient such that v=f(x, y, z, . . . ), wherein f(x, y, z, . . . ) is an expression that does not contain v.
3. Check all other constraint expressions. If they contain v:
   a. Isolate v in the constraint expression E
   b. Store the coefficient c of v
   c. Remove v from the constraint expression
   d. Add c*f(x, y, z, . . . ) to the constraint expression
   e. If the expression has only one remaining variable, then compute new limits on that variable from the range of v.
   f. If the expression E has more than one remaining variable, add two new constraints "E>=A" and "E<=B" where [A,B] are bounds on the range for v.
4. Store separately the expression from step 2 above v=f(x, y, z, . . . )
5. Remove that variable from the input variable list At this point, if any variable has a range with span less than zero, then there are no valid metrology target designs and we return an empty list.

Sampling is performed at block P103. The sampling routine recursively assigns values to a single variable per call. Initially all variables are unassigned. The following algorithm may be used:
1. If a variable is to be assigned, set the variable to its value.
2. If there are dual-constraints that can be evaluated (because all variables in the expressions are assigned), test it. If it fails, return an empty target list.
3. If there are constraint expressions that can be evaluated (because all variables in the expression are assigned), test it. If it fails, return an empty list.
4. If there is an unassigned variable that has a range span of zero, the assign that value (single recursive call, flagging a variable for assignment).
5. If there are any dual-constraints with only one unassigned variable, then compute the possible values for that variable according to the constraint, and sample those values (multiple recursive calls, flagging a variable for assignment).
   a. Skip values as necessary to avoid sampling much more densely than the variable's sampling interval.
6. If there is an unassigned variable that has a range with span greater than zero, the sample the range (multiple recursive calls, flagging a variable for assignment).
   a. The points are centered in the sampling interval,
   b. Values are exactly the sampling interval.

In some embodiments, the range of the variable (in step 6 above) can be adjusted according to an inequality constraint that can be computed. After sampling is complete, for each variable that was removed due to an equality constraint, the stored expression can be used to compute the values for those variables.

In various embodiments, a set of sampling rules are provided externally (e.g., by a user). For example, a user may provide a sampling interval for one or more variables, such as CD and/or pitch. For example, the user may specify a sampling interval of a certain amount of nanometers. In an embodiment, the sampling rule may be to sample CD at intervals of 20 nm, intervals of 40 nm, 60 nm, 80 nm, or 100 nm, and/or sample pitch (and/or all other variables) at intervals of 5 nm, intervals of 10 nm, 15 nm, 20 nm, 25 nm or 30 nm. The sampling interval may be varied during use to increase or decrease sampling density. In an embodiment, a sampling rule can be provided by simulating one or more performance indices for each sampling interval and iteratively reducing the sampling interval until a reducing in the sampling interval does not significantly change the one or more performance indices. In an embodiment, the sampling rule could be according to a formula. Different variables may be sampled at different sampling intervals and/or different sampling densities. As such, a sampling interval or sampling density may be dependent on the nominal value of the variable defined by the lithographic process or the lithographic model. The sampling rule may be non-linear.

The sampling rule may vary in the sampling interval depending on location within the polytope to increase or decrease sampling density.

Thus, in an embodiment, there is provided a metrology design tool that allows a user to specify a variety of geometric and other parameters for a metrology target and give those parameters specific discrete values and/or a range of values. The user and/or the system can also define one or more constraints on the parameters through an algebraic expression. The tool can then identify which combination of parameters gives a feasible metrology target design and then pick which ones to simulate. So, e.g., a target line CD range of 40-100 nm can give a nearly infinite number of choices between 40-100 nm. Then, another parameter can add another nearly infinite number of choices and moreover may be constrained by one or more other parameters (e.g., CD must be less than pitch). Consequently, the domain can be defined as a hypercube of numerous dimensions corresponding to each parameter. An embodiment effectively reduces the hypercube to a convex polytope of potential metrology design targets by applying the one or more constraints to the hypercube and then metrology design targets can be sampled from the polytope or be identified by solving, e.g., an equality constraint. An embodiment applies a rule (e.g., a fixed or varying sampling interval) to automatically sample the polytope meeting all constraints to find a plurality of metrology target designs. In an embodiment, a constraint may be based on the physics of the metrology system (e.g., wavelength of the metrology system can limit pitch/CD). As described herein, a specific algorithm may be used to reduce the hypercube to a particular polytope through the application of the constraints and then apply one or more sampling rules and/or solve a constraint to pick combinations of values of one or more parameters of the polytope to form a plurality of metrology target designs for, e.g., simulation. The result may include ease of use; avoiding manually selecting combinations of dimensions based on experience. The result may include comprehensive coverage, resulting in better targets being simulated.

While the target structures described herein are metrology targets specifically designed and formed for the purposes of measurement, in other embodiments, properties may be measured on targets which are functional parts of devices formed on the substrate. Many devices have regular, grating-like structures. The terms 'target', 'target grating' and 'target structure' as used herein do not require that the structure has been provided specifically for the measurement being performed.

While overlay targets in the form of gratings have been described, in an embodiment, other target types may be used such as box-in-box image based overlay targets.

While metrology targets to determine overlay have been primarily described, the metrology targets may be used to determine, in the alternative or additionally, one or more other characteristics, such as focus, dose, etc.

The metrology targets according to an embodiment may be defined using a data structure such as a pixel-based data structure or a polygon-based data structure. The polygon-based data structure may, for example, be described using GDSII data formats, which are rather common in the chip manufacturing industry. Still, any suitable data structure or data format may be used without departing from the scope of the embodiments. The metrology targets may be stored in a database from which a user may select the required metrology target for use in a particular semiconductor processing step. Such a database may comprise a single metrology target or a plurality of metrology targets selected or identified according to the embodiment. The database may also comprise a plurality of metrology targets in which the database comprises additional information for each of the plurality of metrology targets. This additional information may comprise, for example, information related to a suitability and/or a quality of the metrology target for a specific lithographic process step and may even include suitability and/or quality of a single metrology target to different lithographic process steps. The suitability and/or quality of the metrology target may be expressed in a suitability value and/or a quality value, respectively, or any other value which may be used during a selection process of selecting one metrology target from the database which is to be used for the specific lithographic process step.

In an embodiment, the computer readable medium may comprise instructions for activating at least some of the method steps using a connection to the computer readable medium from a remote computer or from a remote system. Such connection may, for example, be generated over a secure network or via a (secure) connection over the world-wide-web (internet). In this embodiment, users may, for example, log in from a remote location to use the computer readable medium for determining a suitability and/or a quality of the metrology target design. The proposed metrology target design may be provided by the remote computer (or by an operator using the remote computer to provide the metrology target design to the system for determining the suitability of the metrology target design). So the proposed metrology target design which is to be simulated using models may be owned by a different entity or company compared to the models used during the simulation process. Subsequently, the resulting determined suitability to evaluate the metrology target quality may be provided back to the remote computer, for example, without leaving any residual details to excess the proposed metrology target design or the simulation parameters used. In such an embodiment, a customer may acquire the option to run an assessment of individually proposed metrology target designs without owning the software or having a copy of the software at its remote location. Such option may be obtained by, for example, a user agreement. A benefit of such user agreement may be that the models used in the simulations may always be the most recent and/or the most detailed models available without the need to locally update any software. Furthermore, by separating the model simulation and the proposed metrology target proposal, the details of the designed markers or the different layers used for the processing need not to be shared by the two companies.

In association with the physical grating structures of the targets as realized on substrates and patterning devices, an embodiment may include a computer program containing one or more sequences of machine-readable instructions describing a method of designing a target, producing a target on a substrate, measuring a target on a substrate and/or analyzing measurements to obtain information about a lithographic process. This computer program may be executed for example within unit PU in the apparatus of FIGS. 3 and 4 and/or the control unit LACU of FIG. 2. There may also be provided a data storage medium (e.g., semiconductor memory, magnetic or optical disk) having such a computer program stored therein. Where an existing apparatus, for example of the type shown in FIGS. 1-4, is already in production and/or in use, an embodiment can be implemented by the provision of updated computer program products for causing a processor of the apparatus to perform a method as described herein.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

Any controllers described herein may each or in combination be operable when the one or more computer programs are read by one or more computer processors located within at least one component of the lithographic apparatus. The controllers may each or in combination have any suitable configuration for receiving, processing, and sending signals. One or more processors are configured to communicate with the at least one of the controllers. For example, each controller may include one or more processors for executing the computer programs that include machine-readable instructions for the methods described above. The controllers may include data storage medium for storing such computer programs, and/or hardware to receive such medium. So the controller(s) may operate according the machine readable instructions of one or more computer programs.

The invention may further be described using the following clauses:

1. A computer-implemented method of metrology target design, the method comprising:
   providing a range, or a plurality of values, for respective design parameters of a metrology target; and
   by a processor, solving for and/or selecting by sampling within the range or the plurality of values for the design parameters, a plurality of metrology target designs having one or more design parameters meeting a constraint for a design parameter of the metrology target.
2. The method of clause 1, further comprising simulating the plurality of metrology target designs using a lithographic model.
3. The method of clause 1 or clause 2, wherein at least one of the design parameters comprises a geometric dimension of the metrology target.
4. The method of any of clauses 1 to 3, wherein the constraint is for a design parameter different than the ones for which a range or a plurality of values have been provided.
5. The method of any of clauses 1 to 4, wherein providing the range or the plurality of values comprises selection of the range or the plurality of values by a user.
6. The method of any of clauses 1 to 5, wherein the constraint is defined by a user.
7. The method of any of clauses 1 to 6, wherein the constraint comprises a linear algebraic expression.
8. The method of any of clauses 1 to 7, wherein the constraint comprises a relationship between two different geometric dimensions of the metrology target.
9. The method of any of clauses 1 to 8, wherein the metrology target design comprises a plurality of layers and the constraint is between a dimension of one layer and a dimension of another layer.
10. The method of any of clauses 1 to 9, wherein the design parameters comprise pitch, critical dimension and/or trench width.
11. The method of any of clauses 1 to 9, wherein the constraint comprises a physical limitation due to a metrology system used to measure the target.
12. The method of clause 11, wherein the physical limitation includes one or more selected from: a wavelength of radiation used in the metrology system, polarization of radiation used in the metrology system, numerical aperture of the metrology system, target type, and/or a process parameter.
13. The method of any of clauses 1 to 12, wherein selecting by sampling within the range or the plurality of values for the design parameters comprising applying a fixed sampling interval to respective design parameters.
14. The method of clause 13, wherein the sampling interval for one design parameter is different than for another design parameter.
15. The method of any of clauses 1 to 12, wherein selecting by sampling within the range or the plurality of values for the design parameters comprising applying a sampling interval to a design parameter and further comprising simulating a performance index for a sampling interval and iteratively reducing the sampling interval until a reducing in the sampling interval does not significantly change the performance index.
16. The method of any of clauses 1 to 15, further comprising applying the constraint to the range, or the plurality of values, of the design parameters prior to solving for and/or selecting by sampling within the range or the plurality of values for the design parameters, the plurality of metrology target designs.
17. A computer readable medium comprising instructions executable by a computer to perform a method according to any of clauses 1 to 16.
18. The computer readable medium of clause 17, wherein the instructions executable by the computer further comprise instructions for activating at least some of the method steps using a connection to the computer readable medium from a remote computer.
19. The computer readable medium of clause 18, wherein the connection with the remote computer is a secured connection.
20. The computer readable medium of any of the clauses 18 and 19, wherein the range or plurality of values for respective design parameters of the metrology target is provided by the remote computer.
21. The computer readable medium of clause 20, wherein the method is further configured for providing the solving or sampling results of the plurality of metrology target design back to the remote computer.
22. A system to select a metrology target design for use on a substrate, the system comprising:
   a processing unit configured and arranged to:
   providing a range, or a plurality of values, for respective design parameters of a metrology target; and
   solving for and/or selecting by sampling within the range or the plurality of values for the design parameters, a plurality of metrology target designs having one or more design parameters meeting a constraint for a design parameter of the metrology target.
23. The system according to clause 22, wherein the system comprises an connection to a network for communicating with a remote system.
24. The system according to clause 23, wherein the remote system is configured for providing the range or plurality of values for respective design parameters of the metrology target to the system.
25. The system according to clause 23 or 24, wherein the system is configured for using the connection to the remote system for transmitting the solving or sampling results of the plurality of metrology target design back to the remote system.

26. A metrology target configured for being measured using a metrology measurement system, the metrology target being selected by the method of any of the clauses 1 to 16 or by the computer readable medium of any of the clauses 17 to 21.

27. The metrology target according to clause 26, wherein the metrology measurement system comprises a diffraction based measurement system.

28. A metrology measurement system using the metrology target selected by the method of any of the clauses 1 to 16 or by the computer readable medium of any of the clauses 17 to 21.

29. A metrology measurement system configured for measuring the metrology target selected by the method of any of the clauses 1 to 16 or by the computer readable medium of any of the clauses 17 to 21.

30. A substrate comprising the metrology target selected by the method of any of the clauses 1 to 16 or by the computer readable medium of any of the clauses 17 to 21.

31. The substrate according to clause 30, wherein the substrate is a wafer comprising at least some of the layers of an integrated circuit.

32. A lithographic imaging apparatus configured for imaging a metrology target selected by the method of any of the clauses 1 to 16 or by the computer readable medium of any of the clauses 17 to 21.

33. A lithographic imaging apparatus configured for imaging a metrology target according to any of the clauses 26 and 27.

34. A data structure representing the metrology target selected by the method of any of the clauses 1 to 16 or by the computer readable medium of any of the clauses 17 to 21.

35. A data structure representing the metrology target according to any of the clauses 26 and 27.

36. A database comprising the metrology target design selected by the method of any of the clauses 1 to 16 or by the computer readable medium of any of the clauses 17 to 21.

37. The database according to clause 36, wherein the database comprises a plurality of metrology target designs, each selected by the method of any of the clauses 1 to 16 or by the computer readable medium of any of the clauses 17 to 21.

38. A database comprising the data structure according to any of the clauses 34 and 35.

39. The database according to clause 38, wherein the database comprises a plurality of data structures each representing the metrology target design selected by the method of any of the clauses 1 to 16 or by the computer readable medium of any of the clauses 17 to 21.

40. The database according to any of the clauses 36 to 39, wherein the database comprises a suitability value associated with the metrology target design, the suitability value indicating a suitability of the metrology target design for a lithographic process step.

41. A data carrier comprising the data structure according to any of the clauses 34 and 35 and/or comprising the database according to any of the clauses 36 to 40.

42. Use of the metrology target according to any of the clauses 26 and 27, wherein the metrology target is used for determining a positioning of one layer relative to another layer on the substrate, and/or for determining an alignment of a layer on the substrate relative to the projection optics of a lithographic imaging apparatus, and/or for determining a critical dimension of a structure on the substrate.

Although specific reference may have been made above to the use of embodiments in the context of optical lithography, it will be appreciated that an embodiment of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further, although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below. For example, one or more aspects of one or more embodiments may be combined with or substituted for one or more aspects of one or more other embodiments as appropriate. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance. The breadth and scope of the invention should not be limited by any of the above-described exemplary embodiments, but should be defined only in accordance with the following claims and their equivalents.

What is claimed is:

1. A method for a metrology process, the method comprising:

providing a range, or a plurality of values, for respective design parameters of a metrology target for formation, as part of or for the metrology process, as a physical metrology target structure in or on a layer or underlying substrate of a physical resist-coated substrate, the design parameters defining one or more selected from: a geometric characteristic of the metrology target, a characteristic of measurement of the metrology target, and/or a metrology target type;

by a hardware processor system comprising a memory, selecting, by sampling within the range or the plurality of values for the design parameters, a plurality of metrology target designs having one or more design parameters meeting a constraint for a design parameter of the metrology target;

simulating, by the hardware processor system, at least part of the formation and/or measurement of the plurality of metrology target designs using a model; and storing electronic data of at least one of the simulated metrology target designs in a memory of the hardware processor system, where the at least one simulated metrology target design is configured for implementation within a physical measurement target structure, and where the metrology process comprises a step of physically forming the physical measurement target structure based on the stored electronic data, or information derived therefrom, or comprises a step of physically measuring the physical measurement target structure implementing the at least one simulated metrology target design.

2. The method of claim 1, wherein at least one of the design parameters comprises a geometric dimension of the metrology target.

3. The method of claim 1, wherein the constraint is for a design parameter different than the ones for which a range or a plurality of values have been provided.

4. The method of claim 1, wherein providing the range or the plurality of values comprises selection of the range or the plurality of values by a user.

5. The method of claim 1, wherein the constraint is defined by a user.

6. The method of claim 1, wherein the constraint comprises a linear algebraic expression.

7. The method of claim 1, wherein the constraint comprises a relationship between two different geometric dimensions of the metrology target.

8. The method of claim 1, wherein the metrology target design comprises a plurality of layers and the constraint is between a dimension of one layer and a dimension of another layer.

9. The method of claim 1, wherein the design parameters comprise pitch, critical dimension and/or trench width.

10. The method of claim 1, wherein the constraint comprises a physical limitation due to a metrology system used to measure the target.

11. The method of claim 10, wherein the physical limitation includes one or more selected from: a wavelength of radiation used in the metrology system, polarization of radiation used in the metrology system, numerical aperture of the metrology system, target type, and/or a process parameter.

12. The method of claim 1, wherein selecting by sampling within the range or the plurality of values for the design parameters comprising applying a fixed sampling interval to respective design parameters.

13. The method of claim 12, wherein the sampling interval for one design parameter is different than for another design parameter.

14. The method of claim 1, wherein selecting by sampling within the range or the plurality of values for the design parameters comprising applying a sampling interval to a design parameter and further comprising simulating a performance index for a sampling interval and iteratively reducing the sampling interval until a reducing in the sampling interval does not significantly change the performance index.

15. The method of claim 1, further comprising applying the constraint to the range, or the plurality of values, of the design parameters prior to selecting, by sampling within the range or the plurality of values for the design parameters, the plurality of metrology target designs.

16. The method of claim 1, further comprising solving for a metrology target design having one or more design parameters meeting the constraint.

17. A non-transitory computer readable medium comprising instructions that, when executed, cause a hardware computer system comprising a memory, to:

obtain a range, or a plurality of values, for respective design parameters of a metrology target for formation, as part of or for a metrology process, as a physical metrology target structure in or on a layer or underlying substrate of a physical resist-coated substrate, the design parameters defining one or more selected from: a geometric characteristic of the metrology target, a characteristic of measurement of the metrology target, and/or a metrology target type;

select, by sampling within the range or the plurality of values for the design parameters, a plurality of metrology target designs having one or more design parameters meeting a constraint for a design parameter of the metrology target;

simulate at least part of the formation and/or measurement of the plurality of metrology target designs using a model; and storing electronic data of at least one of the simulated metrology target designs in a memory of the hardware processor system, where the at least one simulated metrology target design is configured for implementation within a physical measurement target structure, and where the metrology process comprises a step of physically forming the physical measurement target structure based on the stored electronic data, or information derived therefrom, or comprises a step of physically measuring the physical measurement target structure implementing the at least one simulated metrology target design.

18. The non-transitory computer readable medium of claim 17, wherein the instructions are further configured to cause the hardware computer system to solve for a metrology target design having one or more design parameters meeting the constraint.

19. The non-transitory computer readable medium of claim 17, wherein the constraint is for a design parameter different than the ones for which a range or a plurality of values have been provided.

20. The non-transitory computer readable medium of claim 17, wherein the constraint comprises a relationship between two different geometric dimensions of the metrology target.

* * * * *